United States Patent

Huang et al.

[11] Patent Number: 6,114,198
[45] Date of Patent: Sep. 5, 2000

[54] METHOD FOR FORMING A HIGH SURFACE AREA CAPACITOR ELECTRODE FOR DRAM APPLICATIONS

[75] Inventors: Sen-Huan Huang, Tainan; Yeur-Luen Tu, Taipei; Jin-Dong Chern, Hsinchu, all of Taiwan

[73] Assignee: Vanguard International Semiconductor Corporation, Hsin-Chu, Taiwan

[21] Appl. No.: 09/307,209

[22] Filed: May 7, 1999

[51] Int. Cl.[7] ............ H01L 21/8242; H01L 21/20; H01L 27/108; H01L 29/12
[52] U.S. Cl. ............ 438/239; 438/253; 438/255; 438/398; 438/964; 257/309; 257/915
[58] Field of Search ............ 438/255, 260, 438/398, 239, 253, 256, 399, 964; 257/309, 915

[56] References Cited

U.S. PATENT DOCUMENTS

| | | | |
|---|---|---|---|
| 5,563,090 | 10/1996 | Lee et al. | 437/60 |
| 5,585,300 | 12/1996 | Summerfelt | 437/60 |
| 5,612,558 | 3/1997 | Harshfield | 257/298 |
| 5,618,747 | 4/1997 | Lou | 438/398 |
| 5,741,547 | 4/1998 | Akram et al. | 427/255.2 |
| 5,763,948 | 6/1998 | Sumi | 257/763 |
| 5,885,882 | 3/1999 | Schugraf et al. | 438/398 |
| 5,930,625 | 7/1999 | Lin et al. | 438/253 |
| 5,939,787 | 8/1999 | Lee | 257/740 |
| 5,960,280 | 9/1999 | Jenq et al. | 438/254 |
| 5,998,870 | 12/1999 | Lee et al. | 257/751 |

*Primary Examiner*—Matthew Smith
*Assistant Examiner*—Lex H. Malsawma
*Attorney, Agent, or Firm*—George O. Saile; Stephen B. Ackerman

[57] ABSTRACT

A process for creating a capacitor structure, for a DRAM device, in which the capacitance has been increased via use of a high dielectric constant capacitor dielectric layer, and via the use of a storage node electrode, comprised of a top surface HSG layer, has been developed. The process features deposition of an HSG TiN layer, used as part of a storage node structure, resulting in an increase in storage node electrode surface area, and thus an increase in capacitance.

6 Claims, 3 Drawing Sheets

METHOD FOR FORMING A HIGH SURFACE AREA CAPACITOR ELECTRODE FOR DRAM APPLICATIONS

BACKGROUND OF THE INVENTION

(1) Field of the Invention

This invention relates to a method used to fabricate a semiconductor device, and more specifically to a method used to form a high surface area capacitor structure, for a dynamic random access memory, (DRAM), device.

(2) Description of Prior Art

The use of micro-miniaturization, or the ability to fabricate semiconductor devices with sub-micron features, has allowed DRAM device densities to reach 256 MByte, and beyond. However as the dimension of critical DRAM features are reduced, to accommodate desired densities, difficulties in achieving critical DRAM parameters, such as capacitance, have arisen. For example DRAM cells, using stacked capacitor configurations, are limited by the dimensions of the underlying transfer gate transistor. The capacitance supplied by the stacked capacitor structure, of the DRAM device, is a function of the thickness of capacitor dielectric layer, as well as a function of the area of the capacitor. Since the amount of thickness reduction of the the capacitor dielectric layer is reliability, as well as yield, limited efforts have been directed at increasing DRAM capacitance by increasing capacitor area, while still restricted by the reduced dimensions of the underlying transfer gate transistors.

One method of increasing capacitor surface area, without increasing the dimensions of a stacked capacitor structure, has been the use of hemispherical grained, (HSG), silicon layers, used as a top surface layer for a storage node electrode structure. The HSG silicon layer offers a layer with a series of concave and convex features, thus increasing surface area, and thus capacitance, for the stacked capacitor structure. For example Lou, in U.S. Pat. No. 5,618,747, describes a detailed process for forming a stacked capacitor structure, incorporating an HSG silicon layer. However the use of higher dielectric constant layers, such as barium strontium titanate, (BST), lead zirconate titanate, (PZT), as well as tantalum oxide, offering increased capacitance using thicknesses equal to other materials such as silicon oxide, are more compatible interfacing electrode materials comprised of titanium nitride, (TiN), then silicon materials.

This invention will describe a process for forming capacitor structures using TiN as part of the capacitor structure, and in addition will offer a process in which HSG TiN layer is formed, thus offering increased surface area, and thus increased capacitance, when compared to counterparts fabricated with smooth TiN layers. Prior art, such as Harshfield, in U.S. Pat. No. 5,612,558, describe a method for forming HSG silicon, using an underlying seed layer of TiN, however that prior art does not use HSG TiN for the surface layer of a storage node electrode structure.

SUMMARY OF THE INVENTION

It is an object of this invention to fabricate a capacitor structure, for a DRAM device, with increased surface area.

It is another object of this invention to grow a hemispherical grained, (HSG), titanium nitride, (TiN), layer, and to use the HSG TiN layer as a top surface layer for a storage node electrode.

It is still another object of this invention to use a HSG TiN layer, as part of the upper or cell plate electrode, of a capacitor structure.

It is still yet another object of this invention to use an HSG TiN layer, for capacitor electrodes, when tantalum oxide, $(Ta_2O_5)$, is used as the capacitor dielectric layer.

In accordance with the present invention a process for forming an HSG TiN layer, used as part of, as well as increasing the surface area of, a DRAM capacitor structure, is described. An underlying transfer gate transistor, comprised of a polysilicon gate structure, on a thin gate insulator layer, with source and drain regions, in a semiconductor substrate, is provided. An insulator layer is deposited, followed by the creation of a storage node contact hole, opened in the insulator layer, exposing the top surface of a source and drain region. A first polysilicon layer is deposited on the insulator layer, and completely filling the storage node contact hole, followed by a patterning procedure resulting in the creation of a bottom portion, of a storage node electrode structure. A low pressure chemical vapor deposition, (LPCVD), procedure is used to grow a HSG TiN layer, on the bottom portion of the underlying storage node electrode structure, followed by the formation of a capacitor dielectric layer, such as tantalum oxide, $(Ta_2O_5)$, silicon oxide, silicon nitride, or ONO, (Oxidized silicon Nitride on Oxide). A layer of TiN is next deposited, followed by the deposition of a second polysilicon layer. Patterning of the second polysilicon layer, and of the TiN layer, is performed to create the upper, or cell plate electrode, for the DRAM capacitor structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM device, with increased surface area, and thus increased capacitance, resulting from the use of a bottom capacitor electrode, featuring an HSG TiN layer, as part of the structure, will now be described in detail. The transfer gate transistor, used for the DRAM device in this invention, will be an N channel device. However the capacitor structure, with the increased surface area described in this invention, can also be applied to P channel, transfer gate transistor.

Figure 1:
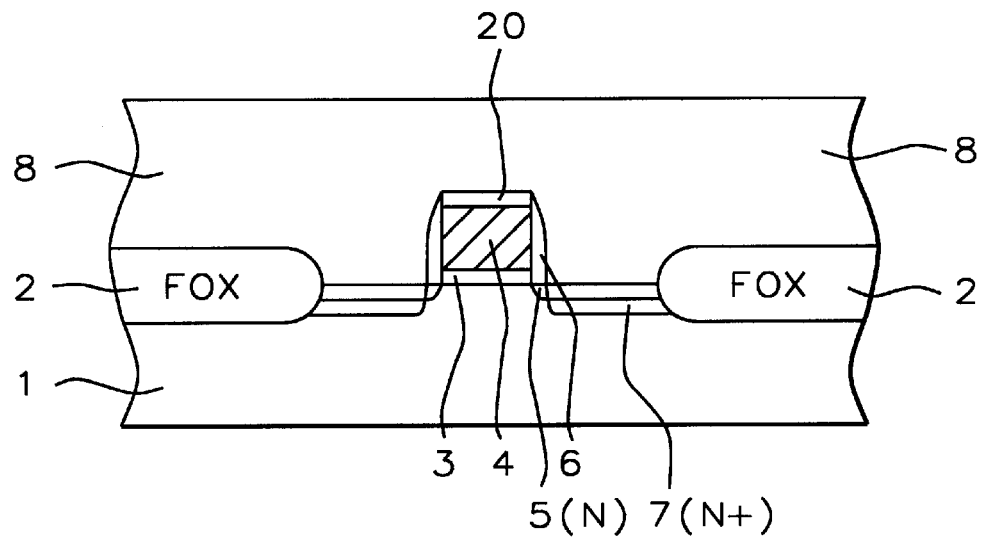
FIGS. 1–5, which schematically shows, in cross-sectional style, the key fabrication stages used in the creation of a DRAM device, with a STC structure, with an increased surface area, resulting from an HSG TiN layer, used as part of the storage node, in direct contact with a capacitor dielectric layer.

Referring to FIG. 1, a P type, semiconductor substrate 1, with a <100>, single crystalline orientation, is used. Field oxide, (FOX), regions 2, are used for purposes of isolation. Briefly the FOX regions 2, are formed via thermal oxidation, in an oxygen-steam ambient, at a temperature between about 850 to 1050° C., to a thickness between about 3000 to 5000 Angstroms. A patterned oxidation resistant mask of silicon nitride-silicon oxide is used to prevent FOX regions 2, from growing on areas of substrate 1, to be used for subsequent device regions. After the growth of the FOX regions 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer 3, of silicon oxide is thermally grown in an oxygen-steam ambient, at a temperature between about 850 to 1050° C., to a thickness between about 50 to 200 Angstroms. A polysilicon layer 4, is next deposited using low pressure chemical vapor deposition, (LPCVD), procedures, at a temperature between about 500 to 700° C., to a thickness between about 1500 to 4000 Angstroms. The polysilicon can either be grown intrinsically and doped via ion implantation of arsenic or phosphorous, at an energy between about 30 to 80 KeV, at a dose between about 1E13 to 1E16 atoms/$cm_2$, or grown using in situ doping procedures, via the incorporation of either arsine or phosphine to the silane ambient. A first silicon oxide layer 20, used as a cap insulator layer, is next grown via the use of either LPCVD or plasma enhanced chemical vapor deposition, (PECVD), procedures, to a thickness between about 600 to 1500 Angstroms. Conventional photolithographic and reactive ion etching, (RIE), procedures, using $CHF_3$ as an etchant for silicon oxide layer 20, and using $Cl_2$ as an etchant for polysilicon layer 4, are used to create polysilicon gate structure 4, with overlying cap insulator layer 20, shown schematically in FIG. 1. Photoresist removal is accomplished via plasma oxygen ashing and careful wet cleans.

A lightly doped source and drain region 5, is next formed via ion implantation of phosphorous, at an energy between about 20 to 50 KeV, at a dose between about 1E13 to 1E14 atoms/$cm^2$. A second insulator layer of silicon oxide is then deposited using either LPCVD or PECVD procedures, at a temperature between about 400 to 700° C., to a thickness between about 1500 to 4000 Angstroms, followed by an anisotropic RIE procedure, using $CHF_3$ as an etchant, creating insulator spacer 6, on the sidewalls of polysilicon gate structure 4. A heavily doped source and drain region 7, is then formed via ion implantation of arsenic, at an energy between about 30 to 100 KeV, at a dose between about 1E14 to 5E16 atoms/$cm^2$. The result of these procedures are schematically shown in FIG. 1.

A third insulator layer 8, comprised of silicon oxide or boro-phosphosilicate glass, (BPSG), is next deposited using LPCVD or PECVD procedures, at a temperature between about 700 to 800° C., to a thickness between about 3000 to 6000 Angstroms. Insulator layer 8, is then subjected to a chemical mechanical polishing, (CMP), procedure, for planarization purposes, providing a smoother surface for subsequent depositions and patterning procedures. The result of these depositions and planarization procedures are also shown schematically in FIG. 1.

Figure 2:
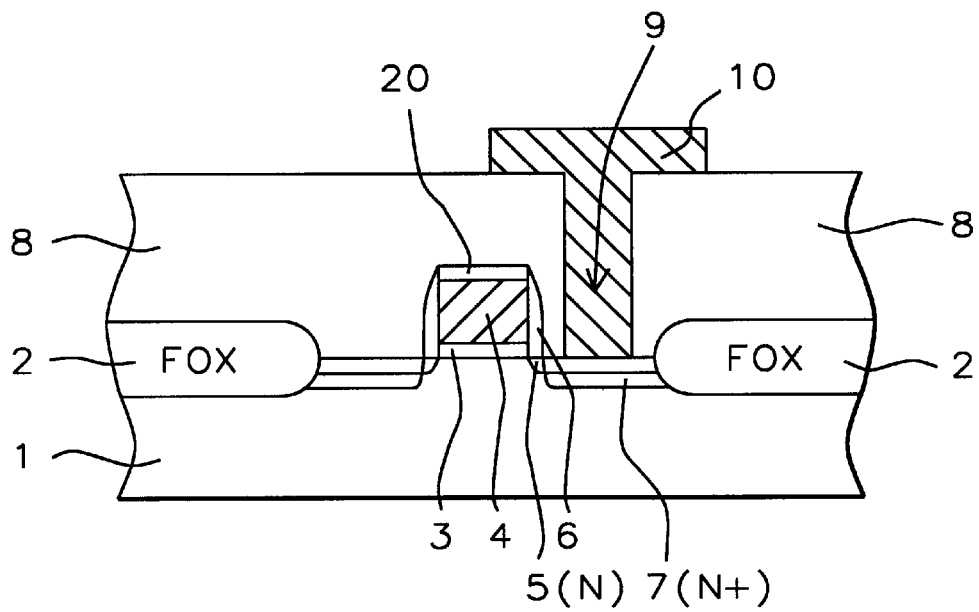

Conventional photolithographic and RIE procedures, using $CHF_3$ as an etchant, are used to create storage node contact hole 9, in insulator layer 8, exposing the top surface of heavily doped source and drain region 7, shown schematically in FIG. 2. Photoresist removal is performed via use of plasma oxygen ashing and careful wet cleans. A second layer of polysilicon layer is next deposited, via LPCVD procedures, at a temperature between about 500 to 700° C., to a thickness between about 1000 to 8000 Angstroms. The second polysilicon layer can be deposited intrinsically and doped via ion implantation of either phosphorous or arsenic, or the second polysilicon layer can be deposited using in situ doping procedures, via the addition of either phosphine or arsine, to a silane ambient. Second polysilicon layer completely fills contact hole 9, contacting underlying heavily doped source and drain regions 7, of the underlying transfer gate transistor. Patterning of second polysilicon layer is accomplished using conventional photolithographic and anisotropic RIE procedures, using $Cl_2$ as an etchant. These procedures allow the formation of polysilicon shape 10, schematically shown in FIG. 2. Polysilicon shape 10, contacting underlying heavily doped source and drain region 7, will be used for the bottom portion for a subsequently formed, storage node electrode. Photoresist removal is performed using plasma oxygen ashing and careful wet cleans.

Figure 3:
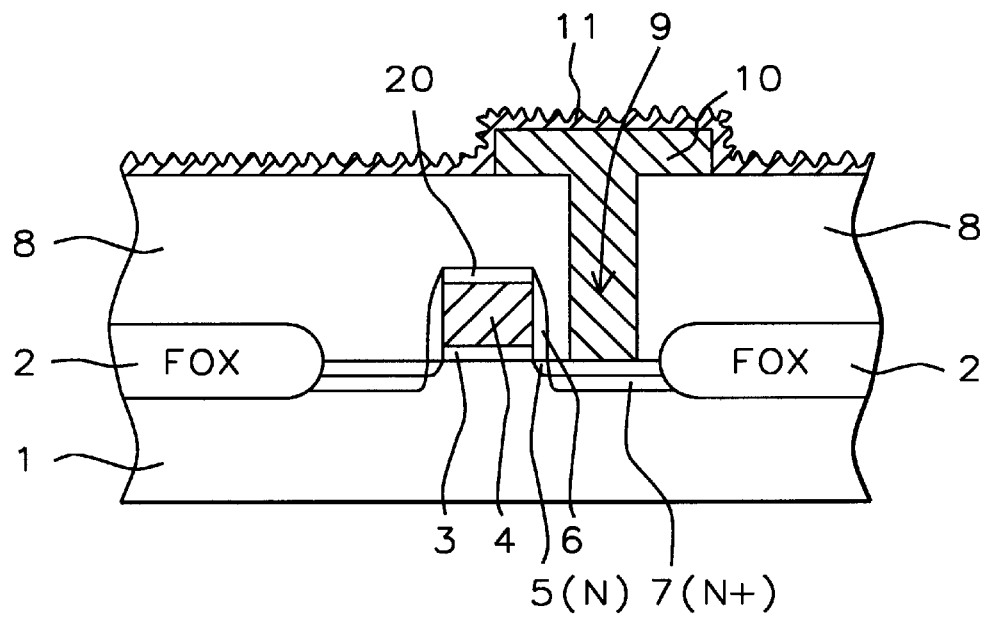

A critical deposition of a hemispherical grained, (HSG), titanium nitride, (TiN), layer 11, is next performed. HSG TiN layer 11, is deposited using an LPCVD procedure, at a temperature between about 350 to 700° C., at a pressure between about 5 to 40 torr, for a time between about 30 to 150 sec., creating a HSG TiN layer between about 200 to 800 Angstroms in thickness. The components used in the LPCVD procedure, for creation of HSG TiN layer 11, are $NH_3$, at a flow of between about 50 to 100 sccm, $TiCl_4$, at a flow between about 10 to 70 sccm, and $N_2$, at a flow between about 2000 to 4000 sccm. The roughened surface of HSG TiN layer 11, results in about twice the surface area, when compared to counterparts comprised of smooth TiN surfaces. This is shown schematically in FIG. 3. After subsequent patterning of HSG TiN layer 11, the storage node electrode will be comprised of a top portion, HSG TiN layer 11, and a bottom portion, polysilicon shape 10.

A capacitor dielectric layer 12, such as $Ta_2O_5$, is next formed via metal organic chemical vapor deposition, (MOCVD), procedures, to an equivalent silicon oxide thickness between about 15 to 35 Angstroms. $Ta_2O_5$ layer 12, can be formed directly on underlying HSG TiN layer 11. Other dielectric layers, such as silicon oxide, silicon nitride, NO, (nitride—oxide), and ONO, (Oxidized silicon Nitride on Oxide), with an equivalent silicon oxide thickness between about 40 to 100 Angstroms, can also be used directly on HSG TiN layer 11.

Figure 4:
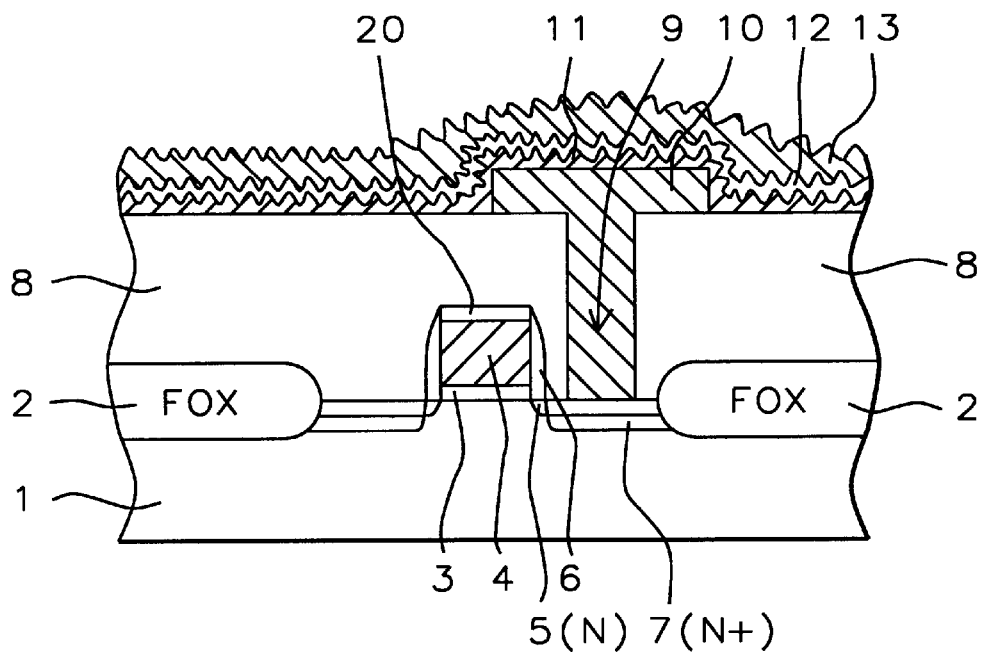
Figure 5:
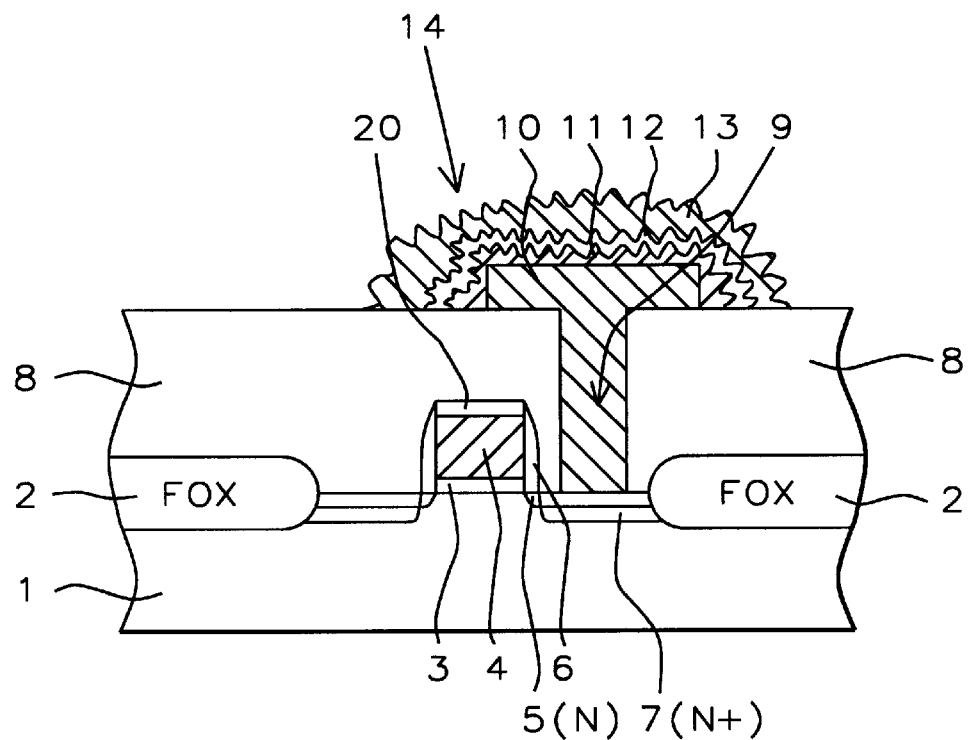

The procedure used to form the upper electrode, or cell plate structure, for the DRAM capacitor structure, is next addressed, and schematically shown in FIGS. 4–5. A first iteration for obtaining the upper electrode structure uses another TiN layer 13, deposited again using LPCVD, or plasma vapor deposition, (PVD), procedures, to a thickness between about 200 to 1500 Angstroms. This TiN layer can be an HSG type TiN layer, or since the desired capacitor roughness has been established using HSG TiN layer 11, as part of a storage node electrode, TiN layer 13, can be formed with a smooth surface. A second iteration comprises the use of a composite layered, upper electrode structure, of an underlying TiN layer, or HSG TiN layer, at a thickness between about 200 to 1000 Angstroms, and an overlying polysilicon layer, at a thickness between about 500 to 2000 Angstroms. This is schematically shown in FIG. 4. If desired a polysilicon electrode, at a thickness between about 500 to 2000 Angstroms, used without the underlying TiN layer, can also be employed. Patterning of upper electrode layer 13, and capacitor dielectric layer 12, and HSG TiN layer 11, is next performed via photolithographic and anisotropic RIE procedures, using $Cl_2$ as an etchant for the TiN and polysilicon layers, and also using $Cl_2$ as an etchant for the capacitor dielectric layer. Photoresist removal is again accomplished using plasma oxygen ashing and careful wet cleans. The storage node capacitor structure 14, is schematically shown in FIG. 5.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a capacitor structure, for a DRAM device, on a semiconductor substrate, featuring a hemispherical grained, (HSG), TiN layer for a lower capacitor electrode, and a TiN layer for an upper capacitor electrode, comprising the steps of:

provnding an underlying transfer gate transistor, comprised of a polysilicon gate structure, on an underlying gate insulator layer, with a source and drain region in said semiconductor substrate;

depositing an insulator layer;

forming a storage node contact hole, in said insulator layer, exposing the top surface of said source and drain region;

forming a bottom polysilicon shape, for a storage node structure, on the top surface of said insulator layer, and in said storage node contact hole, contacting said source and drain region, in said storage node contact hole;

depositing said HSG TiN layer on said bottom polysilicon shape, and on said insulator layer, in a region in which said insulator layer is not covered by said bottom polysilicon shape, with said HSG TiN layer deposited via a low pressure chemical vapor deposition procedure, to a thickness between about 100 to 800 Angstroms, at a temperature between about 350 to 700° C., at a pressure between about 5 to 40 torr, using: between about 50 to 300 sccm of $NH_3$; between about 10 to 70 sccm of $TiCl_4$, and between about 2000 to 4000 sccm of N2, to form said HSG TiN layer comprised with a roughened top surface;

depositing a capacitor dielectric layer on said HSG TiN layer;

depositing said TiN layer, on said capacitor dielectric layer;

forming a photoresist shape on said TiN layer;

patterning of said TiN layer, using said photoresist shape as a mask, to form said upper capacitor electrode, for a capacitor structure, patterning of said capacitor dielectric layer, using said photoresist shape as a mask; and patterning of said HSG TiN layer, using said photoresist shape as a mask to form an HSG TiN shape, on said bottom polysilicon shape, of said storage node structure.

2. The method of claim 1, wherein said bottom polysilicon shape is formed from a polysilicon layer, obtained using an LPCVD procedure, to a thickness between about 1000 to 8000 Angstroms, and patterned to form said bottom polysilicon shape, via an anisotropic RIE procedure, using $Cl_2$ as an etchant.

3. The method of claim 1, wherein said capacitor dielectric layer is a $Ta_2O_5$ layer, deposited using MOCVD procedures, to an equivalent silicon oxide thickness between about 15 to 35 Angstroms.

4. The method of claim 1, wherein said capacitor dielectric layer is chosen from a group that includes silicon oxide, silicon nitride, NO, (nitride—oxide), or ONO, (Oxidized silicon Nitride on Oxide), wherein said capacitor dielectric layer has an equivalent silicon oxide thickness between about 40 to 100 Angstroms.

5. The method of claim 1, wherein said upper capacitor electrode is comprised with either an HSG TiN layer, deposited using LPCVD procedures, to a thickness between about 200 to 1500 Angstroms, or said upper capacitor electrode is comprised of a TiN layer, deposited with a smooth surface, to a thickness between about 200 to 1500 Angstroms.

6. The method of claim 1, wherein said upper capacitor electrode structure is formed via an anisotropic RIE procedure, using $Cl_2$ as an etchant for polysilicon layers, using $Cl_2$ as an etchant for said TiN layer, or for an HSG TiN layer, and using $Cl_2$ as an etchant for said capacitor dielectric layer.

* * * * *